United States Patent [19]

Riva

[11] Patent Number: 5,107,461
[45] Date of Patent: Apr. 21, 1992

[54] EEPROM MEMORY CELL WITH IMPROVED PROTECTION AGAINST ERRORS DUE TO CELL BREAKDOWN

[75] Inventor: Carlo Riva, Monza, Italy

[73] Assignee: SGS-Thomson Microelectronics Srl, Italy

[21] Appl. No.: 549,763

[22] Filed: Jul. 9, 1990

[30] Foreign Application Priority Data

Aug. 1, 1989 [IT] Italy .................. 21402 A/89

[51] Int. Cl.⁵ ............... G11C 7/00; G11C 11/38
[52] U.S. Cl. .................... 365/182; 365/185; 365/189.01; 365/200
[58] Field of Search .......... 365/188, 185, 189.01, 365/200, 182

[56] References Cited

U.S. PATENT DOCUMENTS

| | | |
|---|---|---|
| 3,593,037 | 7/1971 | Hoff Jr. .................. 365/188 X |
| 3,691,537 | 9/1972 | Burgess et al. ............. 365/188 |
| 4,823,316 | 4/1989 | Riva ....................... 365/185 |
| 4,912,534 | 3/1990 | Tanaka et al. ............ 365/185 X |
| 4,958,317 | 9/1990 | Terada .................... 365/185 X |
| 4,961,002 | 10/1990 | Tam et al. ............... 365/185 X |

*Primary Examiner*—Alyssa H. Bowler
*Attorney, Agent, or Firm*—Wolf, Greenfield & Sacks

[57] ABSTRACT

An electrically erasable programmable read only memory (EEPROM) memory cell with 100% redundancy includes two tunnel storage elements (10, 18; 26, 30) which are connected in parallel between a common source voltage (16) and an enabling transistor (22) which is controlled by a transfer terminal (24) and leads to a bit line (14), with respective sensing transistors (12, 28) arranged in series with respect to the storage elements. According to the invention, the cell furthermore includes an auxiliary enabling transistor (40) which is arranged in series with the source and is controlled by the transfer terminal.

1 Claim, 2 Drawing Sheets

EEPROM MEMORY CELL WITH IMPROVED PROTECTION AGAINST ERRORS DUE TO CELL BREAKDOWN

BACKGROUND OF THE INVENTION

1. Field of the Invention

The present invention relates to an EEPROM memory cell with high immunity to programming errors.

2. Description of the Prior Art

As is known, one of the main problems in EEPROM memory cells is the breakdown of the cell's tunnel oxide. This type of breakdown is random and unpredictable, and therefore reduces the performance of this device, limiting to approximately 10,000 the number of assured cycles of the cell during the life of the circuit in which it is inserted. This limitation in the number of write cycles reduces the field of applicability of this type of device.

In order to overcome the above limitation, it has been suggested to produce EEPROM memories with "100% redundancy" cells, i.e. with cells each of which is formed by two storage elements arranged in parallel, with the same bit written to both elements, so that the cell can be read or written correctly even if one of the elements has broken down. In this manner the probability of a random breakdown occurring in both tunnel oxides of the two storage elements which constitute the EEPROM memory cell becomes extremely low, and the maximum number of programming cycles per cell consequently increases. The breakdown events of the two elements are in fact separate and random, and the probabilities that each might occur are consequently independent: therefore the probability of random breakdown of the entire cell is given by the product of the two probabilities of the individual events.

These EEPROM memories are obviously read by using a cell state sensing element which is capable of sensing correctly even if one of the storage elements has broken down. Said "redundant" cells, besides being readable, should however be writable and erasable without errors when one of the two storage elements, usually the tunnel oxide, has broken down. This second requirement is only partially met in known redundant EEPROM memories due to interferences between neighboring cells which will be explained hereinafter.

The aim of the invention is now to provide a redundant EEPROM memory cell of the above described type wherein not only reading but also writing and erasing can always occur without errors even in the case of breakdown of one of the storage elements.

SUMMARY OF THE INVENTION

The invention achieves this aim and other objects and advantages as will become apparent from the following description with an EEPROM memory cell which comprises two tunnel storage elements connected in parallel between a common source voltage and an enabling transistor which is controlled by a transfer terminal and leads to a bit line, with respective sensing transistors arranged in series with respect to said storage elements, characterized in that each cell furthermore comprises an auxiliary enabling transistor which is arranged in series on the source and is controlled by said transfer terminal.

BRIEF DESCRIPTION OF THE DRAWINGS

The invention is now described in greater detail with reference to a preferred embodiment thereof, illustrated in the accompanying drawings, given only by way of non-limitative example, and wherein.

DESCRIPTION OF THE PREFERRED EMBODIMENTS OF THE INVENTION

Figure 1:
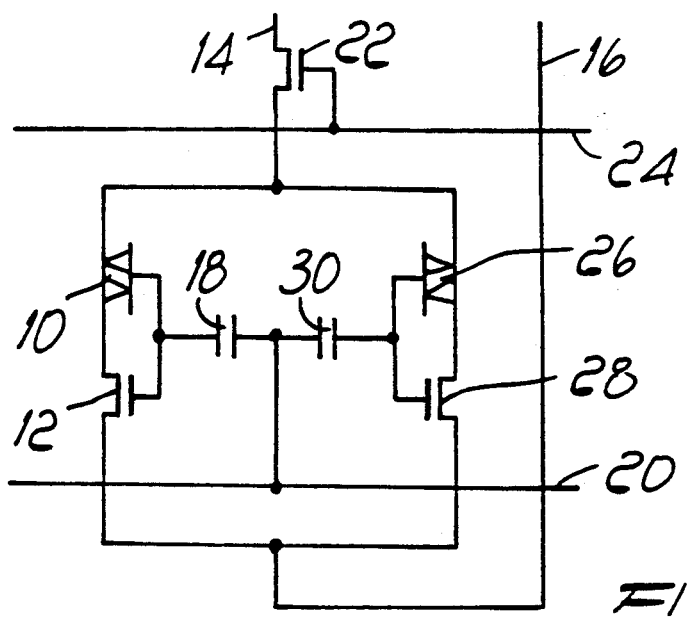
FIG. 1 is a circuit diagram of an EEPROM memory cell with two storage according to the prior art.

With reference to FIG. 1, an EEPROM memory cell with two storage elements, according to the prior art, comprises a first storage element constituted by a tunnel element 10 and by a sensing transistor 12 which are connected in series between a bit line 14 of a memory matrix (not illustrated) and a source common line 16 of the transistor; the gates of the tunnel element 10 and of the sensing transistor 12 are common connected to an electrode of a capacitor 18 the opposite electrode whereof is connected to a line 20 for controlling the control gates. The bit line 14 is furthermore controlled by an enabling transistor 22 which is controlled by a transfer line 24. Finally, the cell comprises a second storage element which is similar to the first one and is constituted by a second tunnel element 26, a second sensing transistor 28 and a second capacitor 30, with the corresponding terminals connected to the same lines.

The typical voltages on the various lines of the memory matrix with this cell configuration, in the different operating conditions, are listed by way of example in the following Table I

TABLE I

|  | erase | write | read |
| --- | --- | --- | --- |
| Bit line | 0 volts | 15 volts | 1 volts |
| Transfer gate | 15 volts | 15 volts | 5 volts |
| Control gate | 15 volts | 0 volts | 2 volts |
| Source | floating | floating | 0 volts |

From Table I it can be seen that in the above described conditions, which are not at all unlikely during the life of these devices, interferences in the write operation on the half-broken erased cell can occur and can modify the contents of the erased cell.

Figure 2:
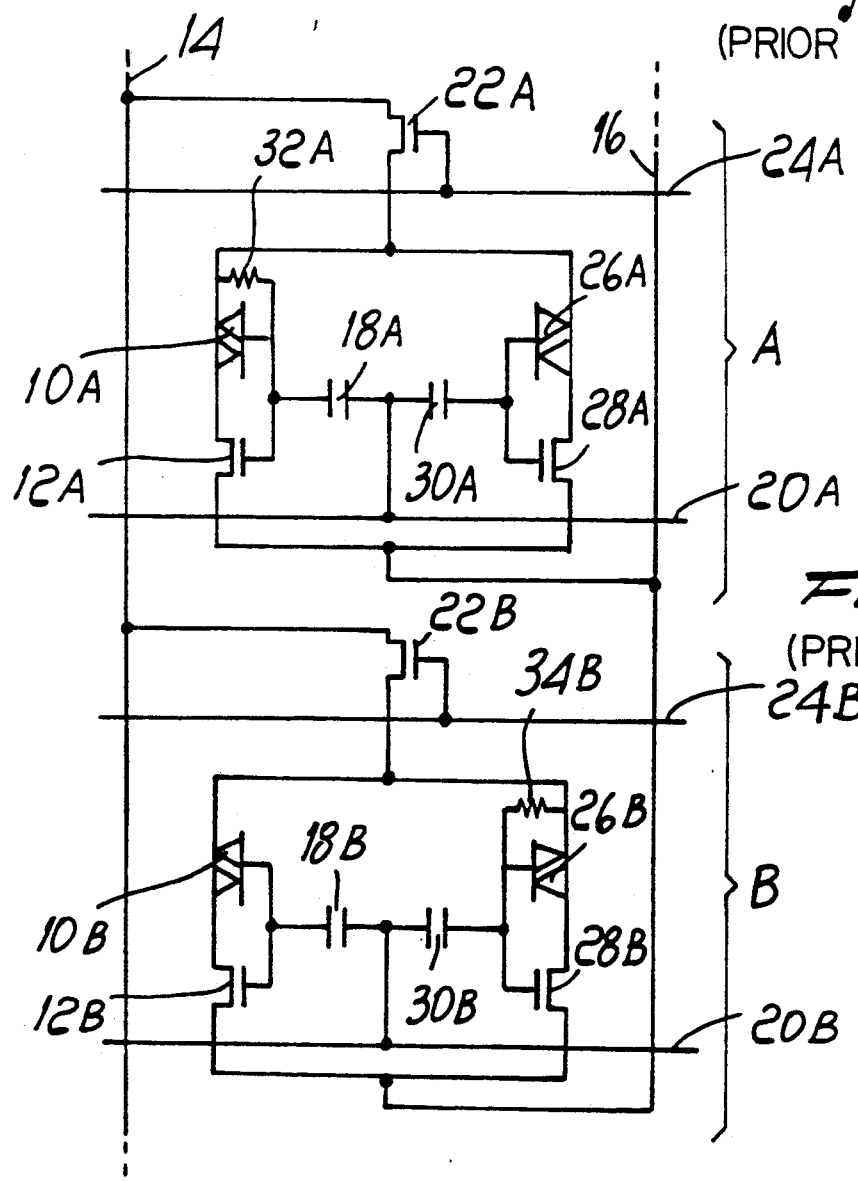
FIG. 2 a circuit diagram of two memory cells of the type of FIG. 1, each of which has a broken-down storage element.

Consider in fact FIG. 2, which illustrates two cells A and B of an EEPROM memory according to FIG. 1, each with a broken tunnel element. The same reference numerals of FIG. 1 have been used in FIG. 2 for the corresponding parts, and association with one cell or the other has been indicated by means of the letters A or B. The breakdown condition of the tunnel elements is represented by equivalent resistors 32A, 348, usually having a low value, arranged in parallel &hereto. If a write operation is performed on the cell A, the resistor 32A at least partially shorts the gate of the sensing transistor 12A with its drain. The sensing transistor 12A then behaves like a diode, which transfers the high voltage present on the bit line 14 to the source 16, which is free to rise, since it is floating. Through the source 16, which is common to the entire device or at least to a column of cells, the voltage reaches the other half-broken cell B, which is in the erased state, altering its charge state and sometimes reversing it.

Figure 3:
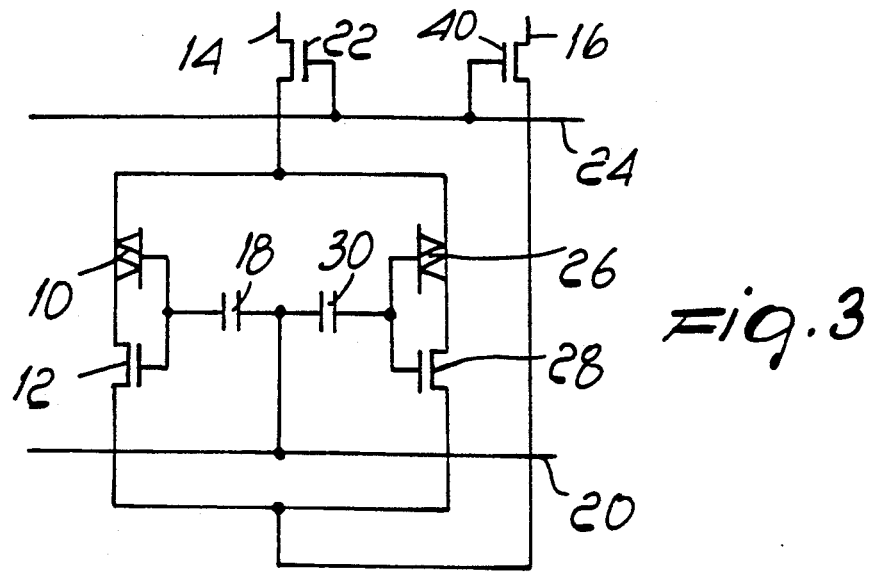
FIG. 3 is a of an EEPROM memory cell with two storage elements, according to the invention.

FIG. 3 illustrates a redundant cell according to the invention. The cell is similar to that of FIG. 1, bears the same reference numerals and differs from the cells of FIG. 1 in that an auxiliary enabling transistor 40 is arranged in series on source line 16 and has its gate connected to the said transfer line 24 terminal which controls the gate of the enabling transistor 22.

The auxiliary enabling transistor enables the connection of a cell source to the common source of the column only when the transfer terminal is enabled (since it is physically located on the same line), i.e. only when the specific cell is being written or is being read, keeping the sources of the other cells of the same column disconnected. It is therefore easy to see, by reapplying the reasoning presented with reference to FIG. 2, that the auxiliary enabling transistor prevents interference of a half-broken cell on other cells during write operations.

Figure 4:
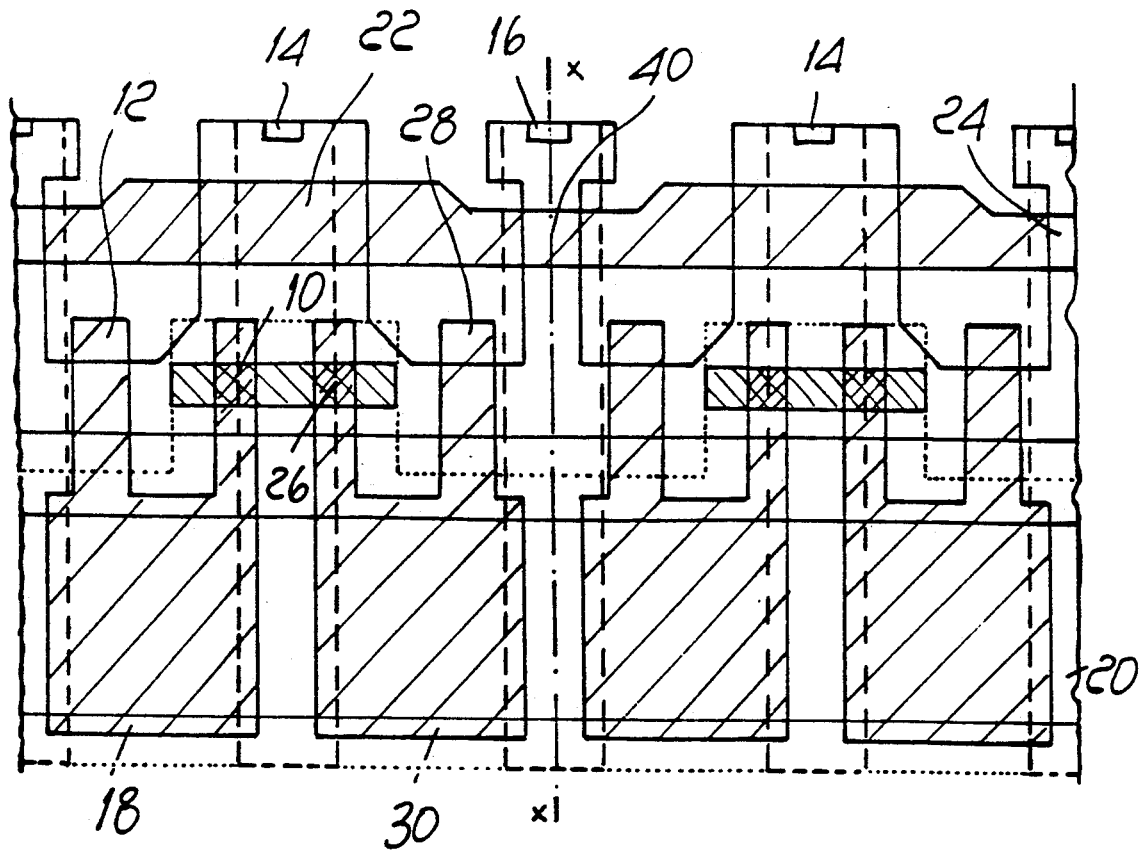
FIG. 4 is a topographic map of a part of an integrated circuit which comprises two adjacent memory cells produced according to the diagram of FIG. 3.

A preferred topography of the EEPROM cell of FIG. 3 with a single polysilicon level, within a memory device, is shown in FIG. 4, which illustrates two adjacent cells which are separated by the dot-and-dash line X—X and wherein the active silicon area is white and is delimited by a solid line, the capacitor implementation region is delimited by a dotted line, the mask which defines the tunnel oxide is indicated by broken lines, the drain areas are delimited by broken lines, the contact terminals are black, and the metallic regions are delimited by broken lines with long dashes. The operative elements are indicated by the same reference numerals as in FIG. 3.

The layout is substantially identical to that of a memory with redundant cells according to the prior art, and the auxiliary enabling transistor 40 is obtained, without varying the cell area or introducing any design or process complication, symmetrically to the main enabling transistor 22. The only drawback is the intrinsic resistance of the added transistor, which is arranged in series on the source of the cell. Said resistance can however be reduced by acting on the size of the transistor and in any case does not affect the correct operation of the EEPROM memory cells. It can be seen that the tunnel element 10 (or 26), the sensing transistor 12 (or 28) and the capacitor 18 (or 30) for each storage element are constituted by a single N+ doped polysilicon block.

The invention can be applied to several types of memory technologies such as single or double polysilicon, etc.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

I claim:
1. EEPROM memory cell, comprising
   a) a bit line connection for carrying digital bits of information;
   b) an enabling transistor connected to said bit line, said enabling transistor enabling and disabling the bit line connection;
   c) a transfer line connected to said enabling transistor for controlling said enabling transistor;
   d) a connection to a voltage source;
   e) first and second tunnel storage elements connected in parallel between the connection to a voltage source and the bit line;
   f) sensing transistors connected in series with said first and second storage elements between the connection to a voltage source and the bit line; characterized by:
   g) an auxiliary enabling transistor connected in series on said connection to a voltage source for enabling and disabling the connection to a voltage source, said auxiliary enabling transistor controlled by said transfer line.

* * * * *